United States Patent
Shim et al.

(10) Patent No.: US 9,871,163 B2
(45) Date of Patent: Jan. 16, 2018

(54) METHOD AND APPARATUS FOR PROGRAMMABLE AND CONFIGURABLE SECTOR LOCALIZATION IN DISTRIBUTED ANTENNA SYSTEM

(71) Applicants: KMW U.S.A., INC., Fullerton, CA (US); SK TELESYS CO., LTD., Seongnam (KR)

(72) Inventors: Joon Hyong Shim, Yongin (KR); Jong Ho Park, Yongin (KR); Dae Ho Woo, Incheon (KR); Dae Kwang Kim, Yongin (KR); Myoung Yong Shin, Seongnam (KR); Young Ho Jeon, Seongnam (KR); Bung Chul Kim, Glendale, CA (US); Nak Zu E, Fullerton, CA (US); Bo Yong Bae, Irvine, CA (US); Daniel Taeyoon Kim, Cypress, CA (US)

(73) Assignees: KMW U.S.A., Inc. CA (US); SK Telesys Co., Ltd. (KR)

( * ) Notice: Subject to any disclaimer, the term of this patent is extended or adjusted under 35 U.S.C. 154(b) by 0 days.

(21) Appl. No.: 15/082,574

(22) Filed: Mar. 28, 2016

(65) Prior Publication Data
US 2017/0127288 A1 May 4, 2017

(30) Foreign Application Priority Data
Nov. 4, 2015 (KR) .................. 10-2015-0154807

(51) Int. Cl.
*H04W 40/00* (2009.01)
*H01L 33/06* (2010.01)
(Continued)

(52) U.S. Cl.
CPC ............ *H01L 33/06* (2013.01); *H01L 33/005* (2013.01); *H01L 33/007* (2013.01);
(Continued)

(58) Field of Classification Search
CPC ....... H04W 16/10; H04W 16/26; H04B 7/026
(Continued)

(56) References Cited

U.S. PATENT DOCUMENTS 8,913,892 B2 12/2014 Berlin et al.
2002/0101937 A1* 8/2002 Antonio ................ H03F 1/3241
375/297

(Continued)

FOREIGN PATENT DOCUMENTS

WO WO-2015-128867 A1 9/2015

OTHER PUBLICATIONS

Korean Office Action (in Korean) dated Nov. 18, 2016 regarding related foreign application (7 pages).

*Primary Examiner* — Nghi H Ly
(74) *Attorney, Agent, or Firm* — Harness, Dickey & Pierce, P.L.C.

(57) ABSTRACT

An apparatus for implementing an adaptive sectorization in a DAS (Distributed Antenna System) is provided. In some embodiment of the present disclosure, a DAS that supports an adaptive sectorization has the flexibility of supporting multiple sectors simply with an extension of STM (Sectorization Module) without being affected by the hardware structure. Where no sector splitting is needed, the STM is replaced by a COM (Head-end Combining Module) to provide a simple structure for supporting the sectors.

22 Claims, 15 Drawing Sheets

(51) Int. Cl.

| | |
|---|---|
| *H01L 33/08* | (2010.01) |
| *H01L 33/00* | (2010.01) |
| *H01L 33/18* | (2010.01) |
| *H01L 33/24* | (2010.01) |
| *H01L 33/36* | (2010.01) |
| *H01L 33/44* | (2010.01) |
| *H01L 33/40* | (2010.01) |
| *H01L 33/38* | (2010.01) |

(52) U.S. Cl.
 CPC .......... *H01L 33/0075* (2013.01); *H01L 33/08* (2013.01); *H01L 33/18* (2013.01); *H01L 33/24* (2013.01); *H01L 33/36* (2013.01); *H01L 33/40* (2013.01); *H01L 33/44* (2013.01); *H01L 33/0095* (2013.01); *H01L 33/382* (2013.01); *H01L 33/387* (2013.01); *H01L 2933/0016* (2013.01); *H01L 2933/0025* (2013.01)

(58) Field of Classification Search
 USPC .............................. 455/446, 422.1, 429, 561
 See application file for complete search history.

(56) References Cited

U.S. PATENT DOCUMENTS

2007/0008132 A1* 1/2007 Bellantoni ................ H01P 5/04
 340/572.1
2013/0071112 A1* 3/2013 Melester ............ H04B 17/0085
 398/38

* cited by examiner

| STM Input Port No. | | 1 | 2 | 3 | 4 | 5 | 6 | 7 | 8 |
|---|---|---|---|---|---|---|---|---|---|
| | | \multicolumn{8}{c}{8x4 STM #1} |
| Frequency Band | | PCS | PCS | PCS | PCS | PCS | 850M | 850M | 850M |
| Power Ratio | Sector 1 | 20.0% | 30.0% | 10.0% | 5.0% | 5.0% | 30.0% | 30.0% | 40.0% |
| | Sector 2 | 30.0% | 30.0% | 30.0% | | | | 30.0% | 40.0% |
| | Sector 3 | 30.0% | 30.0% | 30.0% | | | 30.0% | 30.0% | 40.0% |
| | Sector 4 | | | 50.0% | 50.0% | | 30.0% | 30.0% | 40.0% |

*FIG. 11A*

| STM Input Port No. | | 1 | 2 | 3 | 4 | 5 | 6 | 7 | 8 |
|---|---|---|---|---|---|---|---|---|---|
| | | | | | | 8x4 STM #2 | | | |
| Frequency Band | | PCS | 700M | 700M | 700M | AWS | AWS | AWS | AWS |
| Power Ratio | Sector 1 | 30.0% | 30.0% | 30.0% | 40.0% | 25.0% | 25.0% | 25.0% | 25.0% |
| | Sector 2 | 10.0% | 30.0% | 70.0% | | | 30.0% | 30.0% | 40.0% |
| | Sector 3 | 10.0% | 30.0% | 40.0% | 30.0% | | 30.0% | 30.0% | 40.0% |
| | Sector 4 | | | 50.0% | 50.0% | 25.0% | 25.0% | 25.0% | 25.0% |

*FIG. 11B*

|  | PCS | | | | | |
|---|---|---|---|---|---|---|
|  | STM #1 | STM #1 | STM #1 | STM #1 | STM #1 | HSM #2 |
| STM Input Port No. | #1 | #2 | #3 | #4 | #5 | #1 |
| Power Ratio (%) | 20.0% | 30.0% | 10.0% | 5.0% | 5.0% | 30.0% |
| DL/UL ATT (dB) | 7.0 | 5.0 | 10.0 | 13.0 | 13.0 | 5.0 |

*FIG. 12*

|  | PCS | | | | | |
|---|---|---|---|---|---|---|
|  | STM #1 | STM #1 | STM #1 | STM #1 | STM #1 | HSM #2 |
| STM Input Port No. | #1 | #2 | #3 | #4 | #5 | #1 |
| Max Output Power @ RU | 23dBm | 25dBm | 20dBm | 17dBm | 17dBm | 25dBm |

*FIG. 13*

METHOD AND APPARATUS FOR PROGRAMMABLE AND CONFIGURABLE SECTOR LOCALIZATION IN DISTRIBUTED ANTENNA SYSTEM

CROSS-REFERENCE TO RELATED APPLICATIONS

The present application is based on, and claims priority from, Korean Patent Application Number 10-2015-0154807, filed Nov. 4, 2015, the disclosure of which is incorporated by reference herein in its entirety.

TECHNICAL FIELD

Some embodiments of the present disclosure relate to a configurable or adaptive sectorization technology in a distributed antenna system (DAS).

BACKGROUND

The statements in this section merely provide background information related to the present disclosure and do not necessarily constitute prior art.

A distributed antenna system (DAS) includes a head-end that is linked to signals of a plurality of base stations and a plurality of remote units (RUs) that is installed in an actual service area of the head-end. When a DAS with a single sector configuration is installed in highly populated areas such as a department store or a stadium, it might cause slowdown or interruption of a data service or call block of a voice service due to an excessive number of users. A DAS system supporting sectorization can prevent these problems by dividing the area served by a plurality of physical RUs into a plurality of sectors, and providing each sector with a signal among several different base station signals. Furthermore, a crowded location shifts depending on time windows and circumstances, and in some cases, two or more sectors are provided with a signal from the same base station. Rather than having fixedly divided sectors, adaptive sectorization technology is to adaptively link base station signals to different sectors, depending on time windows and circumstances.

Such technology is described in, for example, U.S. Pat. No. 8,913,892.

FIG. 1 is a block diagram of a DAS for supporting a sectorization. As shown in FIG. 1, a sectorization supporting device 100 includes a RIM (Radio Interface Module) unit 110, a RIM distribution matrix unit 120, an OIM (Optical Interface Module) distribution matrix unit 130, an OIM unit 140 and a RAU (Remote Access Unit) 150.

The RIM unit 110 receives downlink signals from base stations, separates a desired signal from the downlink signals by way of a filter, adjusts a power level of each separated signal, and distributes to the sectors which wants the separated signals.

The RIM distribution matrix unit 120 distributes the signals for the sectors, respectively. A signal to be distributed to a sector can be selected by a radio frequency (RF) switch located on each path for distributing the signals to the desired number Q of the sectors by the RIM unit 110. An output signal for each sector from the RIM distribution matrix unit 120 is inputted to the OIM distribution matrix unit 130 which may be included in the OIM unit 140.

The OIM distribution matrix unit 130 receives the sector-specific output signals from the RIM distribution matrix unit 120, and distributes received signals to the OIM unit 140.

The OIM unit 140 selects one of the sector-specific signals received from the OIM distribution matrix unit 130, converts the selected sector signal into an optical signal, and transmits the optical signal to the RAU 150.

The RAU 150 transmits an uplink optical signal to the OIM unit 140.

The OIM unit 140 converts the optical signal into an RF signal, and transmits the RF signal to the OIM distribution matrix unit 130 through a selected sector path.

The OIM distribution matrix unit 130 transmits a signal coupled for each sector to the RIM distribution matrix unit 120, and the RIM distribution matrix unit 120 transmits the sector-specific signal to each of a plurality of the RIM units 110. Each of the RIM units 110 selects a sector, receives a sector signal from the desired sector, filters the received sector signal, and transmits the filtered sector signal to the base station.

According to the system shown in FIG. 1, the RIM unit 110 includes a circuit for distributing base station signals to a plurality of sectors, and hence the number of sectors to be supported by a single RIM unit 110 ranges from 1 to N. In this case, the RIM unit 110 is designed to support N sectors, or redesigned to match another specified number of sectors less than N in order to minimize the number of unused paths.

For example, if the RIM unit 110 rated to support up to eight sectors utilizes only three sectors, five paths remain unused. This leaves unnecessary circuits for supporting the five extra paths to the disadvantage of the RIM unit 110 in terms of cost, size, and power consumption. In addition, where no adaptive sectorization is needed, it suffices that the RIM unit 110 supports only one sector, requiring none of a distribution circuit, an RF switch, an isolator, and the like for supporting the sectorization; however, the very presence of the circuits for supporting the eight sectors becomes redundant.

In the above-illustrated example, the RIM unit 110 requires circuits for distributing sector-specific signals regardless of whether there is a need for an adaptive sectorization. Further, utilizing a single RIM unit 110 designed to support a plurality of sectors occasionally results in excess sector-specific distributing circuits to no purpose. In order to minimize unused sector-specific distributing circuits, multiple RIM units 110 should be developed to meet the exact number of sectors to support, multiplied by the number of types of RIM units 110 depending on supported frequencies, resulting in a very wide range of RIM models to produce and manage according to the variety of sectors and frequency bandwidths.

SUMMARY

In accordance with some embodiments, the present disclosure provides a head-end unit for supporting a variable sectorization in a DAS (Distributed Antenna System), the head-end unit comprising a plurality of FEMs (Front-end Modules), at least one downlink STM (Sectorization Module), a plurality of DTMs (Distribution Modules), and a plurality of HOMs (Head-end Optic Modules). Each of FEMs is configured to receive a downlink RF signal of a corresponding base station among a plurality of supporting base stations, filter the downlink RF signal to generate a filtered signal, and adjust a power level of the filtered signal to generate a level-adjusted signal. The at least one downlink STM is configured to split each of the level-adjusted signals into a plurality of splitted signals by the number of supporting sectors, selectively attenuate at least one of the plurality of splitted signals in order to control a combination of the respective splitted signals associated with the individual level-adjusted signals for each of the supporting sectors, and combine the selectively attenuated signals to generate a respective downlink sector signal for each of the supporting sectors. Each of the DTMs is connected to at least one HOM (Head-end Optic Module) and is configured to distribute the downlink sector signal to the at least one HOM. Each of the HOMs is optically connected to a remote unit located in the supporting sectors and is configured to transmit the downlink sector signal to the remote unit.

In some embodiments, each of the plurality of HOMs is further configured to optically receive a uplink signal from the corresponding remote unit, each of the plurality of DTMs is further configured to generate a uplink RF sector signal based on at least one uplink signal transferred by the at least one HOM, and the head-end unit further comprises at least one uplink STM (Sectorization Module). The at least one uplink STM is configured to split each of the uplink RF sector signals into a plurality of splitted signals by the number of supporting base stations, selectively attenuate at least one of the plurality of splitted signals to control a combination of the respective splitted signals associated with the individual uplink RF sector signals for each of the supporting base stations, combine the selectively attenuated signals to generate a respective uplink RF signal for each of the supporting base stations, and transmit the up-link RF signals for each of the supporting base stations to the FEMs.

In accordance with another embodiment, the present disclosure provides an apparatus in downlink path for supporting an variable sectorization in a DAS (Distributed Antenna System). The apparatus comprises a plurality of downlink splitters, a plurality of downlink combiners, a plurality of downlink RF circuits, a plurality of second downlink power controllers, and a plurality of downlink power detectors. Each of the downlink splitters is configured to split a received base station signals into a plurality of splitted signals by the number of the supporting sectors. Each of the downlink combiners is assigned to a corresponding sector among the supporting sectors and is configured to combine the selectively attenuated signals. Each of the downlink RF circuits is connecting each downlink splitter to all the plurality of downlink combiners. Each downlink RF circuit comprises a downlink attenuator connected to an output port of the downlink splitter and a first downlink power controller connected to an input port of the downlink combiner. Each of the second downlink power controllers is connected to an output port of a corresponding downlink combiner among the plurality of downlink combiners. Each of downlink power detectors is configured to detect a power level at an output port of a corresponding downlink combiner among the plurality of downlink combiners.

In accordance with yet another embodiment, the present disclosure provides an apparatus for supporting a variable sectorization of an uplink path in a DAS. The apparatus comprises a plurality of uplink power detectors, a plurality of power controllers, a plurality of uplink splitter, a plurality of uplink combiners, and a plurality of uplink RF circuits. The plurality of uplink power detectors are configured to detect power levels of a plurality of uplink RF sector signals of a plurality of supporting sectors. The plurality of power controllers are configured to control the power levels of the plurality of uplink RF sector signals and to generate a plurality of level-adjusted signals. The plurality of uplink splitter are configured to split each of the plurality of level-adjusted signals into a plurality of splitted signals by the number of the supporting base stations. Each of the uplink combiners being configured to generate a uplink RF signal associated with a corresponding base station among supporting base stations. The plurality of uplink RF circuits are connecting each of the uplink splitter to all the plurality of uplink combiners. Each uplink RF circuit comprises a first uplink attenuator connected to an output port of the first splitter and a second uplink attenuator connected to an input port of the first combiner.

In accordance with yet another embodiment, the present disclosure provides a method of supporting a variable sectorization of a downlink path in a DAS. The method comprises receiving a downlink RF signal of a corresponding base station among a plurality of supporting base stations, filtering the downlink RF signal to generate a filtered signal, and adjusting a power level of the filtered signal to generate a level-adjusted signal. The method further comprises splitting each of the level-adjusted signals into a plurality of splitted signals by the number of supporting sectors, selectively attenuating, for each of the supporting sectors, at least one of the plurality of splitted signals in order to control a combination of the respective splitted signals associated with the individual level-adjusted signals, and combining, for each of the supporting sectors, the selectively attenuated signals to generate a downlink sector signal. The method further comprises optically transmitting, for each of the supporting sectors, the downlink sector signal to at least one remote unit located in the respective supporting sector. In some embodiments, the splitting step, the selectively attenuating step, and the combining step are implemented by i) presenting a plurality of downlink combiners to generate a plurality of downlink sector signals for the supporting sectors, ii) presenting a plurality of RF circuit to connect each of the plurality of downlink splitters to all the plurality of downlink combiners, and iii) selectively attenuating, by the downlink attenuators, at least one of the plurality of splitted signals for each of the supporting sectors. Each downlink RF circuit comprises a downlink attenuator connected to an output port of the downlink splitter and a downlink power controller connected to an input port of the downlink combiner.

In accordance with yet another embodiment, the present disclosure provides a method of supporting a variable sectorization of an uplink path in a DAS. The method comprises generating, for supporting sectors, uplink RF sector signals based on uplink signals received from remote units, and splitting each of the uplink RF sector signals into a plurality of splitted signals by the number of supporting base stations. The method further comprises selectively attenuate at least one of the plurality of splitted signals to control a combination of the respective splitted signals associated with the individual uplink RF sector signals for each of the supporting base stations, combining, for each base station, the selectively attenuated signals to generate respective up-link RF signals for each FEMs, transmitting the respective up-link RF signals to said each base station.

BRIEF DESCRIPTION OF DRAWINGS

FIGS. 11A and 11B are sectorization tables of a DAS, for a first 8×4 STM unit and a second 8×4 STM unit respectively, according to at least one embodiment.

FIG. 12 is a table of user-defined power ratios of a DAS, for the Personal Communication Service (PCS) band of a first sector, according to at least one embodiment.

FIG. 13 is a table of maximum powers of a DAS for different paths provided a remote unit (RU) has the maximum output power of 30 dBm, according to at least one embodiment.

DETAILED DESCRIPTION

Exemplary embodiments of the present disclosure are described below with reference to the accompanying drawings.

Although exemplary embodiments of the present disclosure will be described for illustrative purposes, those skilled in the art will appreciate that various modifications, additions and substitutions are possible, without departing from the idea and scope of the claimed disclosure. Accordingly, one of ordinary skill would understand the scope of the claimed disclosure is not to be limited by the explicitly described embodiments herein but by the claims and equivalents thereof, and all the equivalent technical ideas thereto should be construed as included in the scope of the disclosed embodiments.

Some embodiments provide a DAS for supporting an adaptive sectorization and flexibly supporting a plurality of sectors, as needed, simply by adding STMs (Sectorization Modules) regardless of hardware configuration.

Where no adaptive sectorization is needed, the STMs are replaced with the COMs (Head-end Combining Modules) to support the sectors with a simple structure.

Some embodiments of the present disclosure distinguish themselves from U.S. Pat. No. 8,913,892 to Coring ("the '892 patent") by obviating the need for a distribution circuit for supporting a plurality of sectors in the RIM unit 110 and rather having a module (STM unit) separated from the RIM unit and dedicated to sectorization. The separation of the distribution circuit for supporting a plurality of sectors from the RIM unit simplifies the structure of the RIM unit and allows to use a single RIM module for each frequency.

Moreover, in accordance with the number of sectors involved, the embodiments can utilize a number of sectorization supporting modules for providing an adaptive sectorization function with an appropriate combination of the STM unit and the FEM unit (a head-end front module without the distribution circuit for supporting multiple sectors existed in the RIM unit). The COM unit is applied where no adaptive sectorization function is needed, by which the DAS is supported in a simple manner at low cost.

Figure 1:
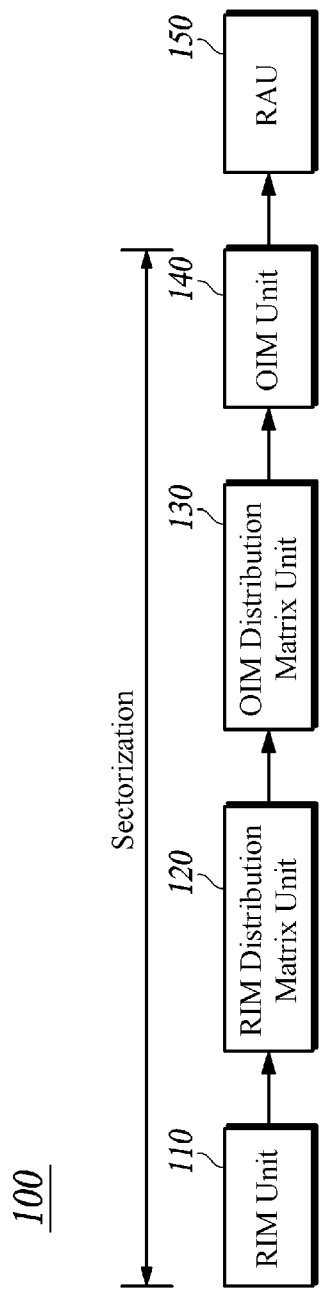
FIG. 1 is a block diagram of a distributed antenna system (DAS) for supporting the sectorization of the prior art.
Figure 2:
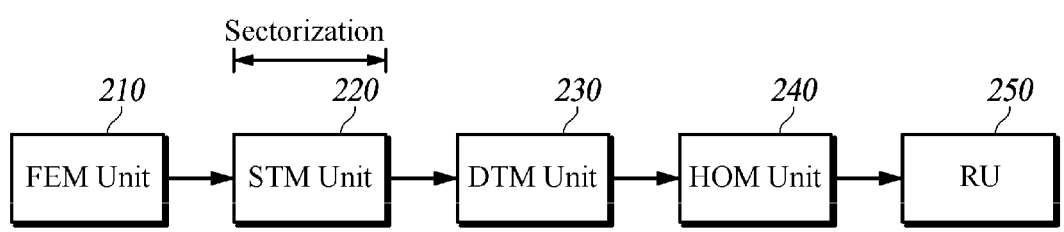
FIG. 2 is a block diagram of a DAS for supporting an adaptive sectorization, according to at least one embodiment of the present disclosure.

FIG. 2 is a block diagram of a DAS for supporting an adaptive sectorization, according to at least one embodiment of the present disclosure. A DAS 200 includes a FEM unit 210, an STM unit 220, a DTM (Head-end Distribution Module) unit 230, a HOM (Head-end Optic Module) unit 240 and RUs (Remote Units) 250.

The FEM unit 210 receives multiple downlink RF (Radio Frequency) signals from multiple base stations, separates a desired downlink RF signal from the multiple downlink RF signals by using a filter, and adjusts the level of the separated downlink RF signal.

The STM unit 220 receives a level-adjusted downlink signal from the FEM unit 210, and combines downlink signals determined for each sector by using an RF switch.

The DTM unit 230 is specific to each sector, combines the specific sector downlink signals received from the STM unit 220, and distributes to the combined downlink signals to the HOM unit 240.

The HOM unit 240 converts the downlink RF signal received from the DTM unit 230 into an optical signal, and transmits the optical signal to the RUs 250.

Upon receiving a downlink optical signal from the HOM unit 240, the RUs 250 convert the optic signal into a downlink RF signal, performs an amplification and a filtering of the downlink RF signal before outputting the downlink RF signal via an antenna to a service area. Also, the RUs 250 perform filtering and level-adjusting of an uplink RF signal received via an antenna before optically converting and transmitting the uplink RF signal to the HOM unit 240.

In the prior art including the '892 patent, the RIM unit determines base station signals to be combined to the respective sectors by using an RF switch. Conventionally, a RIM distribution matrix unit combines the signals for each sector, and an OIM distribution matrix unit distributes the sector-specific combined signals to a number N of OIM units. For the purpose of determining the sector signals for sending from the OIM unit to its connected remote access unit or RAU, the prior art implements the adaptive sectorization function with a complicated four-step structure which is, however, reduced by some embodiments of the present disclosure down to a two-step structure for coupling sector-specific combined signals. In some present embodiments, the STM unit 220 distributes a plurality of input signals after reception from the FEM unit 210 by the required number of sectors, and adjusts an attenuation value with an attenuator, thus combining the selected signals for transmission after determining transmission or non-transmission of the distributed signals.

To change a sector signal for sending to an RU in the prior art typified by the '892 patent has been recognized as making a choice from determined multiple sector signals at an OIM unit. Assuming that a specific sector to be sent to the RUs 250 from the STM unit 220 includes a combination of base stations A, B and C, embodiments of the present disclosure redefine the change of sector signal for sending to the RU 250 to mean recombining base station signals (e.g., to another combination of base station signals A, D and E) to be outputted to the relevant sector from the STM unit 220.

The '892 patent offers the RIM distribution matrix unit dedicated to signal combination for each sector in a separate entity from the OIM distribution matrix unit dedicated to the selection of a sector for sending to the RAU. In contrast, some present embodiments introduce a simplified circuit form of the STM unit 220 that performs a unified process of transmitting signals through a recombination to the RUs 250.

Figure 3:
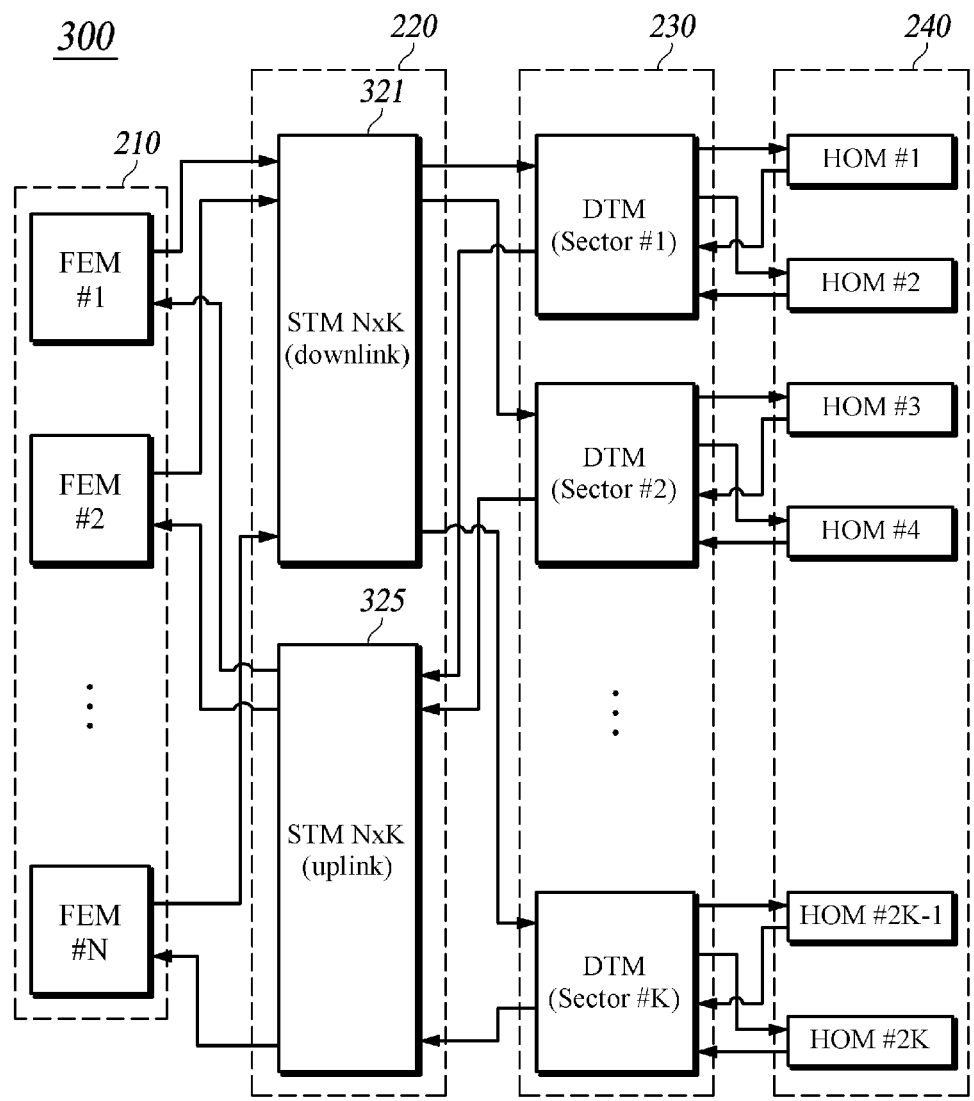
FIG. 3 is a diagram of a configuration of a DAS for supporting an adaptive sectorization, according to at least one embodiment of the present disclosure.

FIG. 3 is a block diagram with a configuration of a DAS 300, including the FEM unit 210, STM unit 220, DTM unit 230 and HOM unit 240, for supporting an adaptive sectorization, according to at least one embodiment of the present disclosure.

The FEM unit 210 receives downlink signals respectively transmitted from N base stations, separates a desired signal from the downlink signals by using a filter, amplifies a level of the separated signal, and filters and level-adjusts an uplink signal received from the STM unit 220, and then transmits the level-adjusted signal to a linked base station.

The STM unit 220 includes a downlink signal-processing STM 321 and an uplink signal-processing STM 325. The downlink STM 321 receives N base station signals from the FEM unit 210, combines base station signals to be provided for respective sectors, and transmits the sector-specific signals to the DTM unit 230 that is provided for each sector. The uplink STM 325 receives K sector signals from the DTM unit 230, where K is a natural number, and transmits a corresponding signal to the FEM unit 210 that is linked with each sector.

There are K (natural number) DTMs provided in the DTM unit 230 for the respective sector, and they serve to distribute a specific sector signal received from the STM unit 220 to a HOM unit 240.

Figure 4:
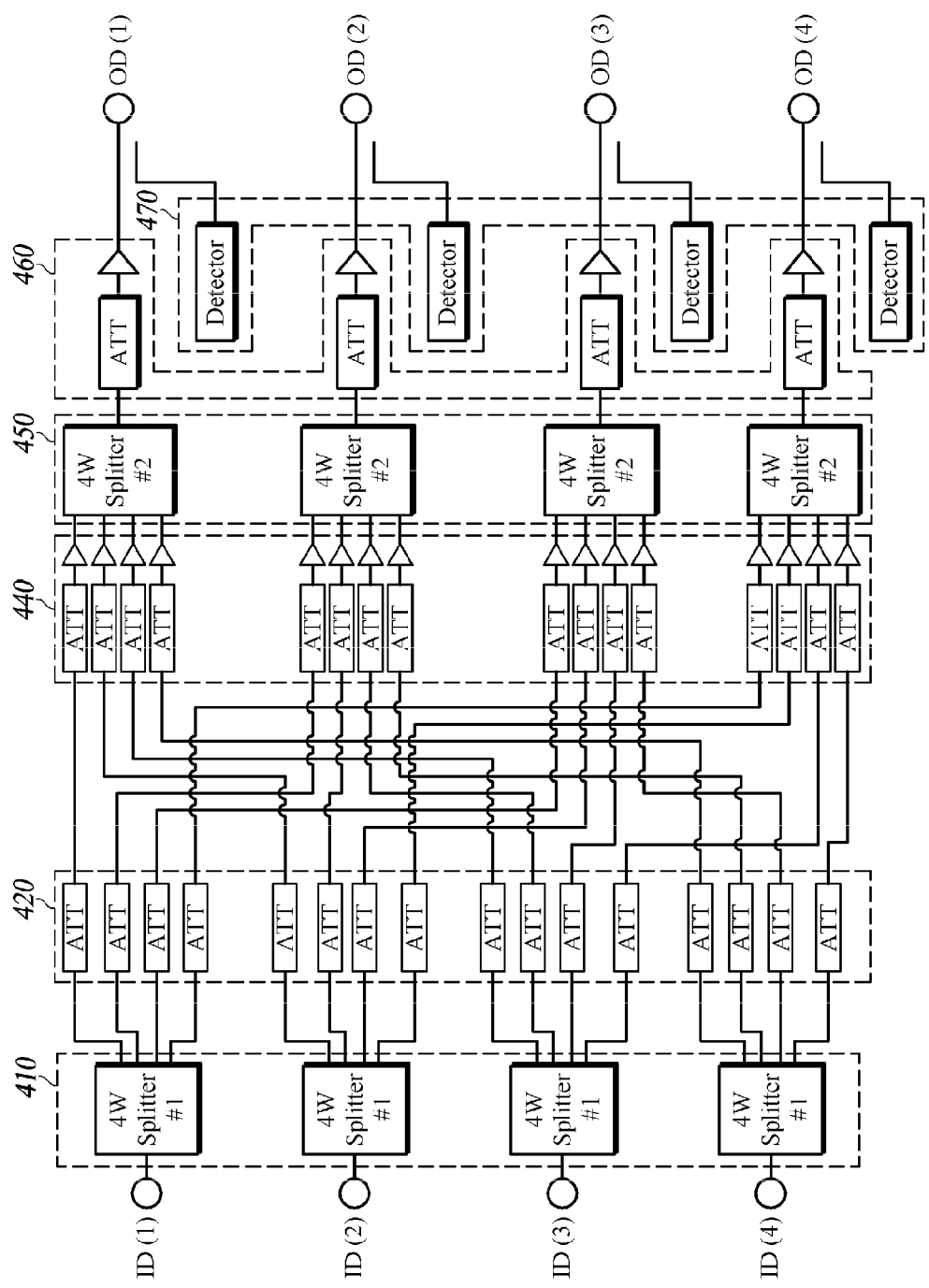
FIG. 4 is a diagram of an internal configuration of a downlink 4×4 STM unit, according to at least one embodiment.

FIG. 4 is an internal block diagram of a downlink 4×4 STM unit 320, according to at least one embodiment. The downlink 4×4 STM unit 320 includes a 1:4 splitter unit 410, an attenuator unit 420, a power controller unit 440, a 4:1 splitter unit 450, a power controller unit 460, and a detector unit 470.

Depending on the configuration of the DAS, various types of the STM unit 220 can be designed, such as 2×4 STMs, 4×8 STMs and 8×8 STMs. For example, in case of 4×4 STMs, the configuration receives four base station input signals at IDs abbreviated for inputs in downlink, and generates output signals at ODs abbreviated for outputs in downlink to four sectors, and the configuration allows the signal outputted to each sector to assume any combination of the inputted base station signals.

The 1:4 splitter unit 410 divides the signals received from respective base stations into four groups of signals to support the four sectors, and then determines whether to transmit the signal distributions to the respective sectors via the attenuator unit 420.

The attenuator unit 420 sets the attenuation value to the minimum for a sector that requires a distribution, and sets the attenuation value to the maximum for a sector that requires no distribution, thus transmitting the signal exclusively to the sector that requires the distribution and blocking the distribution of the signal to the sector that requires no distribution. In this case, the maximum attenuation value of the attenuator unit 420 is at least 60 dB or more. By setting the attenuation value of the attenuator unit 420 to the maximum for the sector that requires no distribution, output ports of the 1:4 splitter unit 410 are always in impedance-matched condition at 50Ω, thus preventing degradation of VSWR (Voltage Standing Wave Ratio) characteristics of open input ports of the STM unit 220 and maximizing an isolation between the output ports of the 1:4 splitter unit 410.

The power controller unit 440 may include multiple attenuators and amplifiers. When multiple base station input signals of the same frequency band, which are present in a single sector, is linked to RUs 250 in a specific frequency band, the plurality of base station signals of the same frequency band requires to share a fixed composite output power of RUs 250. By adjusting the attenuation value of the power controller unit 440 after the attenuator unit 420, the downlink 4×4 STM unit adjusts the power ratio of multiple base station signals with the same frequency band to share the fixed composite output power of the RUs 250. The 4:1 splitter unit 450 combines signals adjusted through the power controller unit 440. The STM unit 220 performs an ALC (Auto Level Control) operation by using the power controller unit 460 and the detector unit 470, not to allow an output level for each sector to exceed the defined maximum output power.

The power controller unit 460 includes multiple attenuators and amplifiers. Signals passing through the power controller unit 460 are outputted to output ports.

The detector unit 470 is configured to monitor the power level of the signals outputted to the output ports. That is, in some embodiments, the output value is monitored to check whether the signal transmitted from the base station has an appropriate power level to block an overpower output from the RUs 250, and the output value is automatically adjusted through the ALC operation to prevent an overpower from being outputted from the RUs 250.

When distributing the base station input signals transmitted to a specific sector by using the 1:4 splitter unit 410 in FIG. 4, if only two ports of the 1:4 splitter unit 410 are used for distribution to the specific sector and the remaining two ports are opened, the 1:4 splitter unit 410 might suffer from degraded VSWR characteristics at the two ports in use as well as the input ports thereof. As a countermeasure, the attenuation value of the attenuator unit 420 connected to the two unused output ports of the 1:4 splitter unit 410 is set to the maximum, so as to minimize the effect of the two unused output ports. Accordingly, the attenuator unit 420 performs functions of selecting a path for transmitting the signal to the sector that requires the distribution, preventing degradation of the VSWR characteristics of the output ports of the 1:4 splitter unit 410, and maximizing the isolation between the connected output ports of the 1:4 splitter unit 410.

Figure 5:
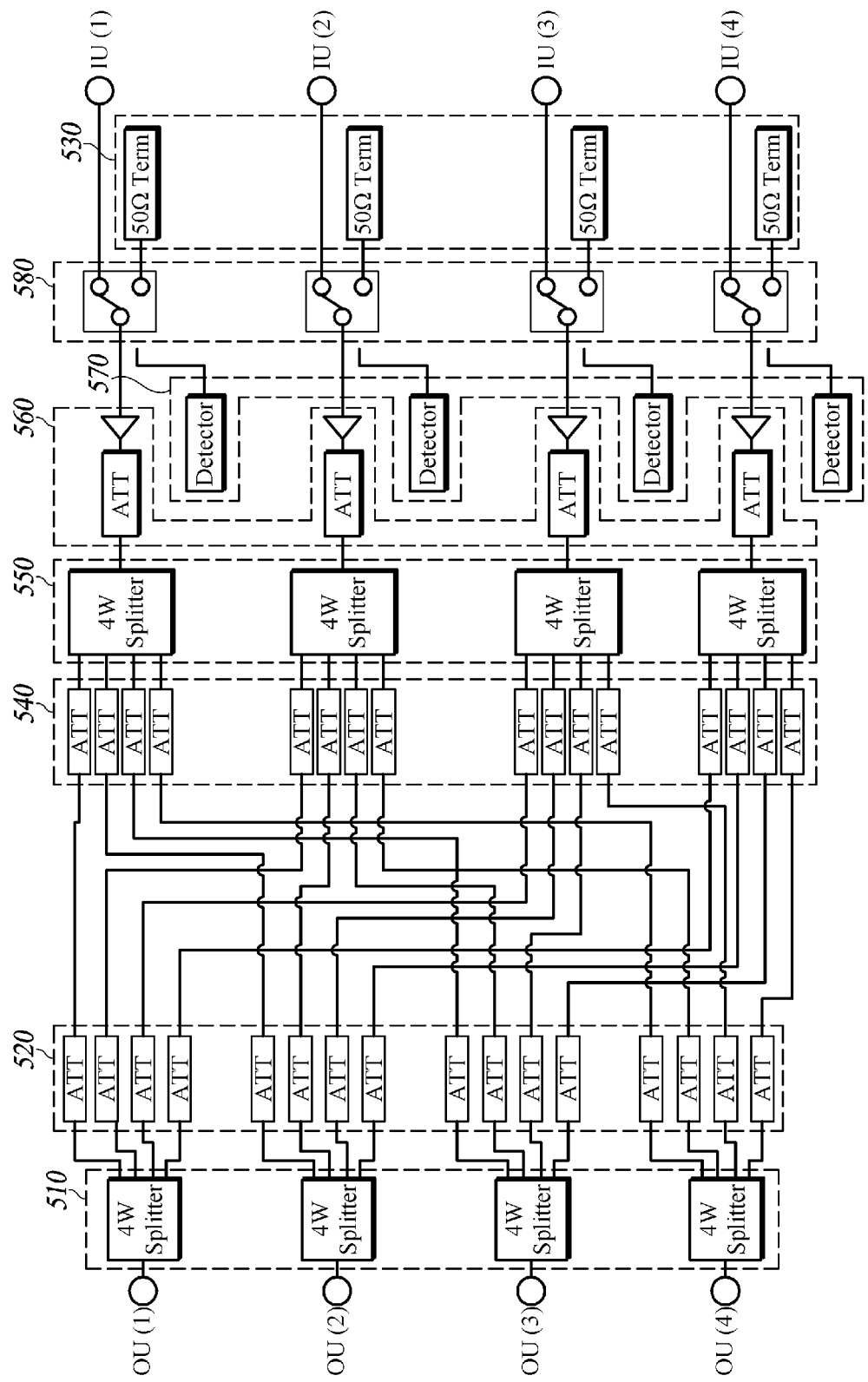
FIG. 5 is a diagram of an internal configuration of an uplink 4×4 STM unit, according to at least one embodiment.

FIG. 5 is an internal block diagram of an uplink 4×4 STM unit, according to at least one embodiment. The uplink 4×4 STM unit includes a 4:1 splitter unit 510, an attenuator unit 520, an attenuator unit 540, a 1:4 splitter unit 550, a power controller unit 560, a detector unit 570, an RF switch unit 580 and a termination resistor unit 530.

In some embodiments, various types of the STM unit 220 in the DAS are composed of, for example, 2×4 STMs, 4×8 STMs and 8×8 STMs. Similar to the downlink 4×4 STM, the uplink 4×4 STM has a structure that supports four inputs at IUs representing inputs in uplink and four output signals at OUs representing outputs in uplink to four sectors. An optical signal inputted from the RUs 250 is converted into an RF signal at the HOM unit 240, and transferred to the DTM unit 230.

The DTM unit 230 combines the received signals from HOM unit 240, and distributes to the STM unit 220. When the distributed signals are linked with only two out of the illustrated four sectors in FIG. 4, two input ports of the STM unit 220 are opened.

The open input ports degrade the VSWR characteristics of the ports of the attenuator unit 560, 1:4 splitter unit 550, attenuator unit 540, attenuator unit 520 and 4:1 splitter unit 510, which in turn degrades the VSWR characteristics of the output ports of the 4:1 splitter 510 and the isolation characteristics between the input ports of the 4:1 splitter 510. To prevent such degradation, when the uplink input port of the STM unit 220 is not used, the termination resistor unit 530 is connected to one terminal of the RF switch unit 580. 50Ω resistors are used in the termination resistor unit 530; however, the present disclosure is not necessarily limited to this configuration.

The STM unit 220 has, at its respective uplink input ports, the detector unit 570 that includes detectors for monitoring the strengths of the sector-specific input signals. As with the downlink 4×4 STM unit, when a single sector encompasses a plurality of mobile station input signals in the same frequency band, the uplink 4×4 STM unit performs an ALC operation for holding each signal from exceeding the maximum input level for each sector. The attenuator unit 560 is used for the ALC operation to appropriately adjust the attenuation value not to allow an overpower to be inputted to a corresponding uplink path with reference to a signal strength detected by the detector unit 570. The signals adjusted through the attenuator unit 560 are distributed by the number of sectors supported by the 1:4 splitter unit 550.

The uplink attenuator 540 of the STM unit 220 is applied with the same value as applied to the downlink power controller 440 of the STM unit 220, which has been applied in the downlink arrangement to adjust the ratio of a plurality of base station signals of the same frequency band to share a fixed composite output power of the RUs 250. The attenuator unit 520 determines whether to transmit the signal passed the attenuator unit 540. When transmitting the signal, the attenuation value of the attenuator unit 520 is set to the minimum, and when not transmitting the signal, the attenuation value of the attenuator unit 520 is set to the maximum. In this case, the maximum value of the attenuator unit 520 is at least 60 dB or more. The signals selected for each sector while passing through the attenuator unit 520 are combined by the 4:1 splitter unit 510 and then outputted to the output ports.

Figure 6A:
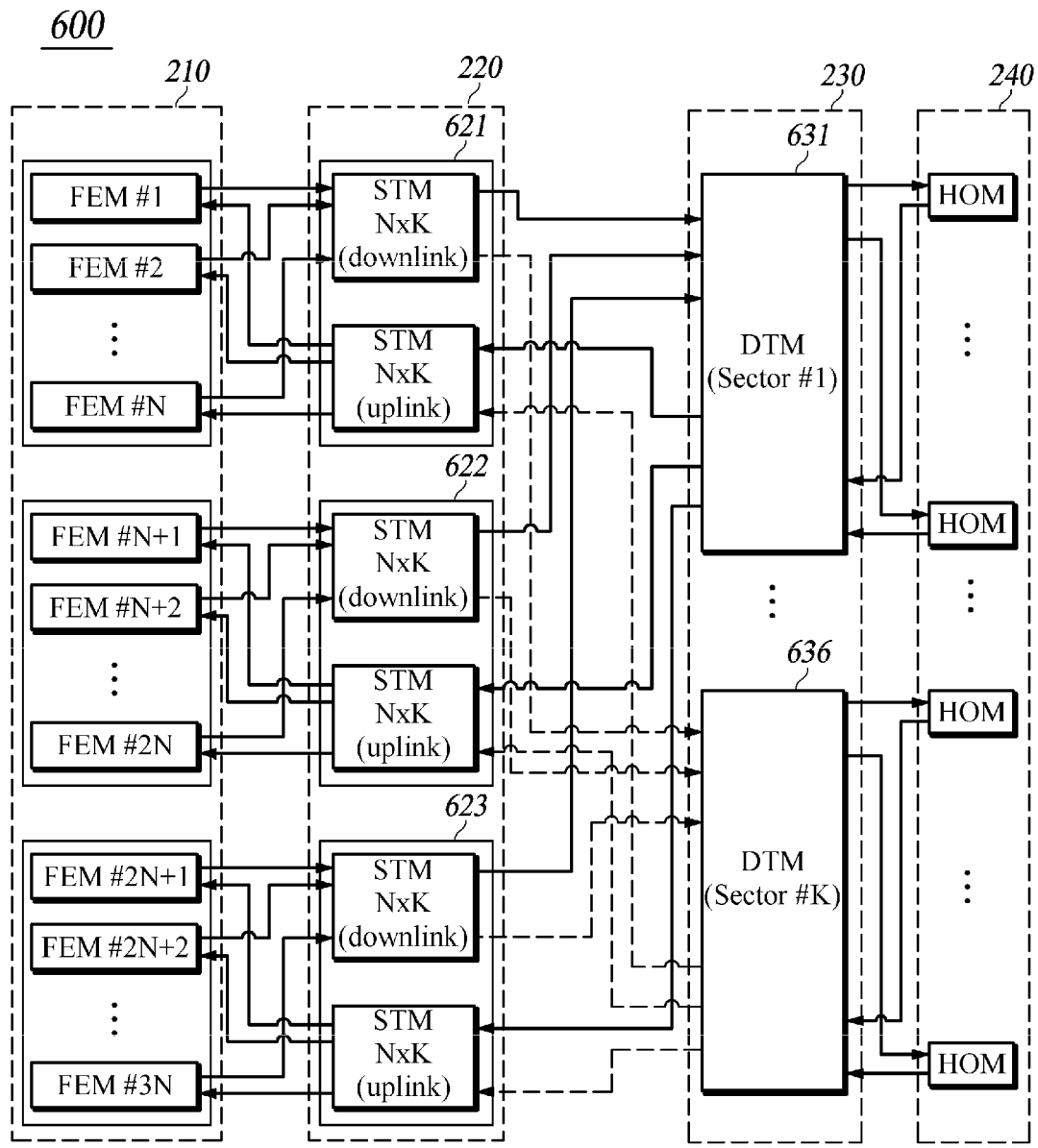
FIGS. 6A and 6B are diagrams of DAS configurations for supporting an adaptive sectorization and increasing the number of input ports, according to at least one embodiment.
Figure 6B:
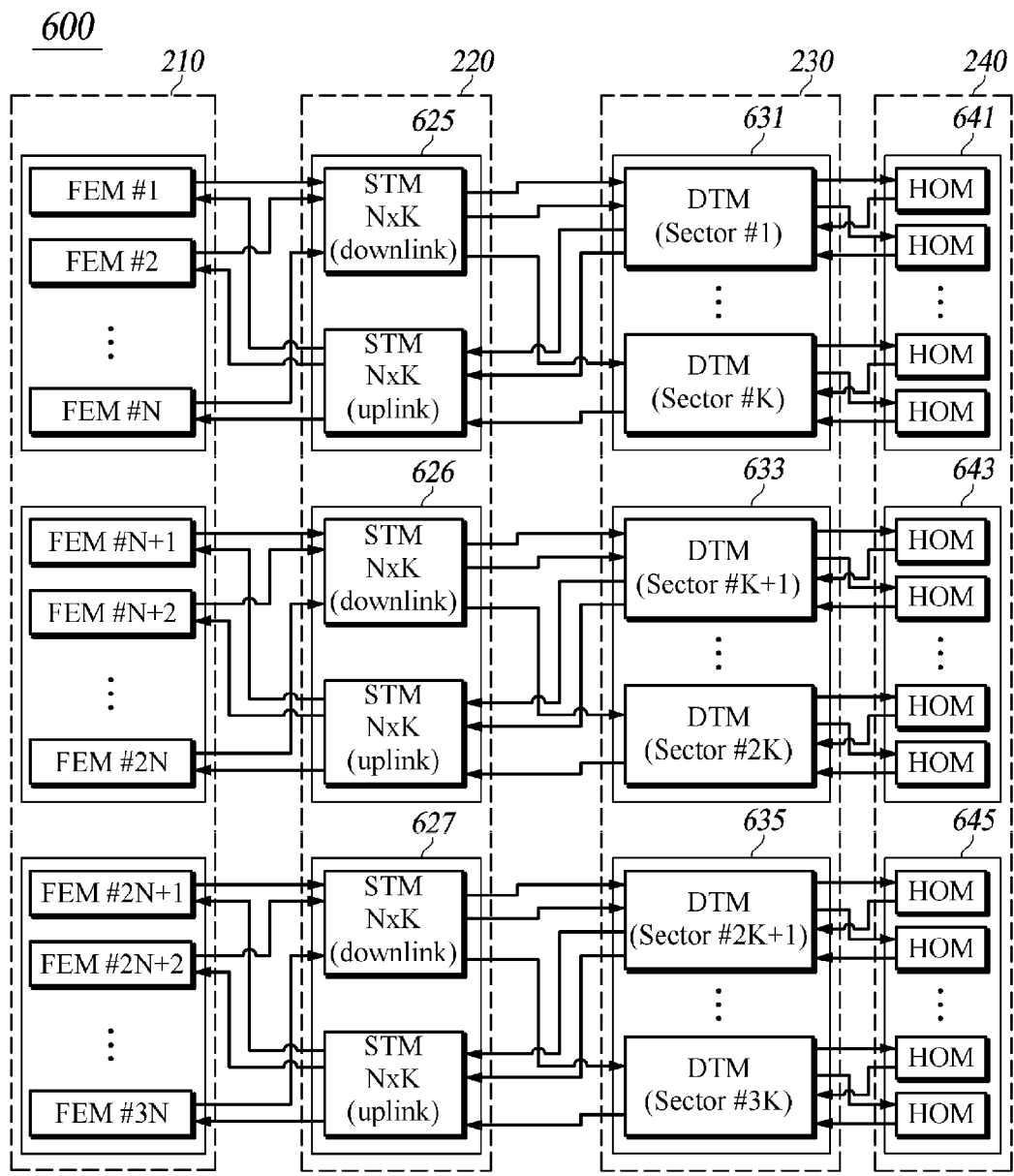

FIGS. 6A and 6B are block diagrams with DAS configurations for supporting an adaptive sectorization and increasing the number of input ports, according to at least one embodiment. In the example shown in FIGS. 4 and 5, the 4×4 STM unit supports four sectors with respect to four input signals. To support more than four input ports required in an actual design, the number of supportable input ports can be increased by adding more 4×4 STMs as shown in FIGS. 6A and 6B.

A DAS 600 in FIG. 6A includes the FEM unit 210, STM unit 220, DTM unit 230 and HOM unit 240.

When the number of FEM to be supported increases to 3N, FEM can be defined as FEM #1 to N, FEM #N+1 to 2N and FEM #2N+1 to 3N, where N is a natural number equal to or larger than 2.

The STM unit 220 has three STM sub-units 621, 623 and 625 to support 3N FEM.

The difference between FIG. 6A and FIG. 6B is on the number of supported sector. When it needs to increase the number of FEM up to 3N without increasing the number of sector in a DAS supporting N FEM input, K sector such as FIG. 3A, FIG. 6A illustrates that the increase of the number of FEM up to 3N can be supported by adding only two more STM sub-units.

Figure 7:
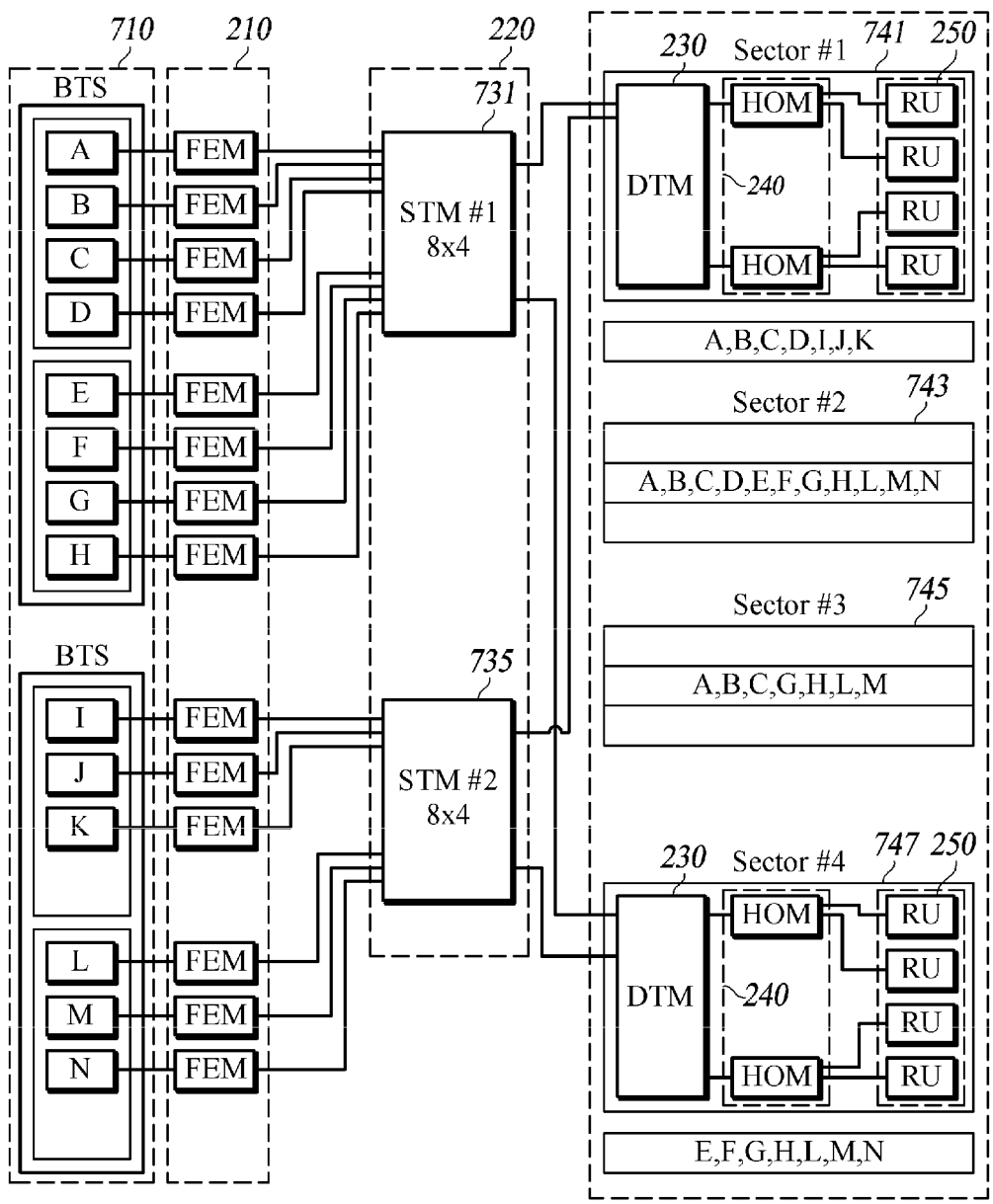
FIG. 7 is a diagram of a configuration of a DAS for supporting an adaptive sectorization, according to at least one embodiment.

Whereas, FIG. 6B illustrates that the increase of the number of sector up to 3N can also be supported with the increase of the number of FEM up to 3N, FIG. 7 is a block diagram with a configuration of a DAS 700 for supporting an adaptive sectorization, according to at least one embodiment. The DAS 700 includes base stations 710 shown in groups BTS, the FEM unit 210, the STM unit 220 and a sector unit 740.

The STM unit 220 has a first 8×4 STM unit 731 that receives input signals of A to H base stations, and a second 8×4 STM unit 735 that receives input signals of I to N base stations. The first 8×4 STM unit 731 combines selectively the needed signals among the base stations signals A to H for a first sector 741 in the sector unit 740, and sends the combined signals to the DTM unit 230 of the first sector 741. The second 8×4 STM unit 735 combines selectively the needed signals among the base station signals I to N for a first sector 741, and sends the combined signals to the DTM unit 230 of the first sector 741. The DTM unit 230 of the first sector 741 combines signals sent from the two STM units 731, 735, re-distributes the combined signals, and transmits the signals to the RUs 250 via the HOM unit 240. In the same manner, each of the DTM units 230 of second, third and fourth sectors 743, 745, and 747 combines and distributes signals sent from the two STM units 731, 735 for each sector. The DTM unit 230 of each sector combines signals sent from a plurality of STM units, and distributes the signals to the HOM unit 240. The HOM unit 240 converts a combined RF signal into an optical signal, and transmits the optical signal to the RUs 250.

Figure 8:
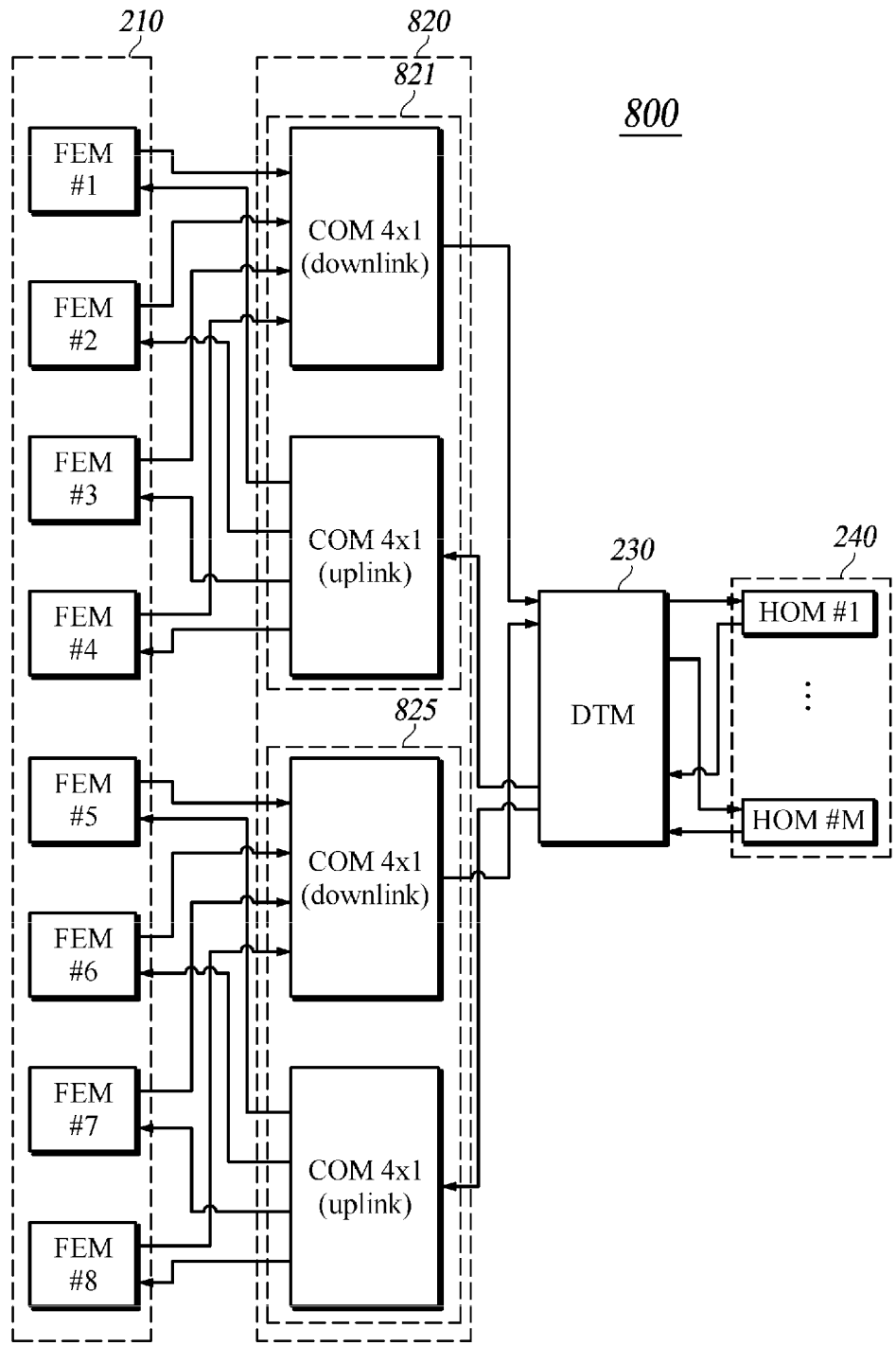
FIG. 8 is a diagram of a configuration of a DAS implemented by a COM (Head-End Combining Module) unit, according to at least one embodiment.

FIG. 8 is a block diagram with a configuration of a DAS 800 implemented by a COMs (Head-End Combining Modules), according to at least one embodiment. The DAS 800 includes the FEM unit 210, a COM unit 820, the DTM unit 230 and the HOM unit 240.

When no adaptive sectorization is required, the COM unit 820 directly combines signals received from the FEM unit 210 and transmits the combined signals to the DTM unit 230, thus eliminating the additional requirements of the RF switch, the attenuator, the splitter and others for supporting the adaptive sectorization. A non-sectorization arrangement incorporates the COM unit 820, thus reducing the cost compared to a case where the STM unit 220 is incorporated for supporting a plurality of sectors and minimizing an installation space requirement.

Figure 9:
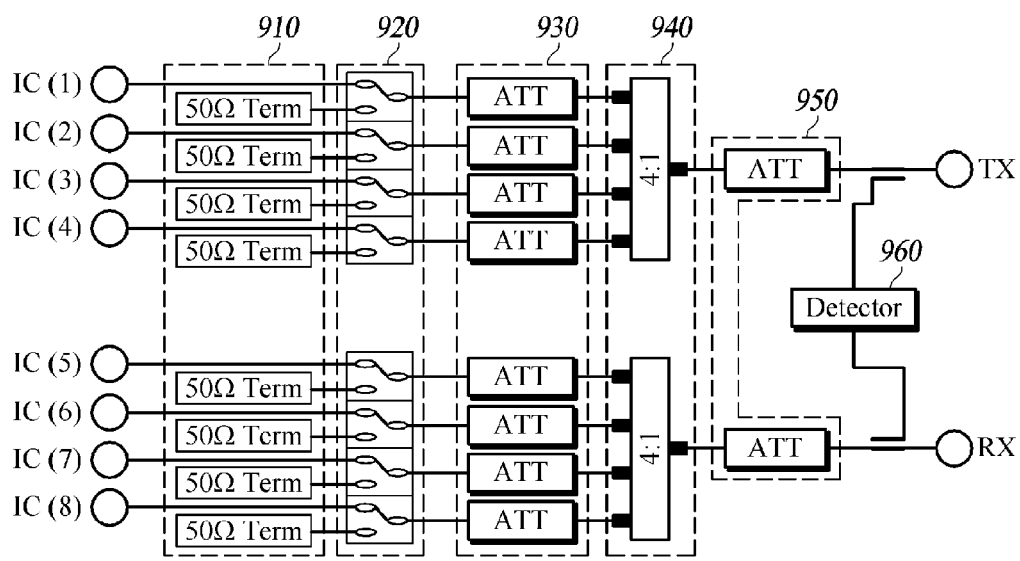
FIG. 9 is a diagram of an internal configuration of a 4×1 COM unit, according to at least one embodiment.

FIG. 9 is an internal block diagram of the 4×1 COM unit 820, according to at least one embodiment. The 4×1 COM unit 820 includes a termination resistor unit 910, an RF switch unit 920, an attenuator unit 930, a 4:1 splitter unit 940, an attenuator unit 950 and a detector unit 960.

With downlink signals, input ports at IC in connection with the FEM unit 210 close the RF switch unit 920 to transmit signals to the attenuator unit 930, and input ports at IC in disconnection with the FEM unit 210 connect the RF switch unit 920 to the termination resistor 910 so as to maximize the VSWR characteristics of the COM unit 820 and the isolation between the paths.

The attenuator unit 930 attenuates power levels of signals that pass through the RF switch unit 920. The downlink signals passed through the attenuator unit 930 are combined at the 4:1 splitter unit 940, pass through the attenuator unit 950, and then are outputted to output ports.

The attenuator unit 950 is used to perform an ALC operation for attenuating the signals to hold them from exceeding the maximum downlink output level with reference to a downlink signal strength detected by a detector 960.

With uplink signals, the attenuator unit 950 is used to perform ALC operation for attenuating the signals to hold them from exceeding the maximum uplink input level with reference to an uplink signal strength detected by the detector 960. The uplink signals passed through the attenuator unit 950 are divided by the 1:4 splitter unit 940, attenuated by the attenuator unit 930, and then outputted to the output ports via the RF switch unit 920.

In the same manner as the STM unit 220, the COM unit 820 in the downlink adjusts the attenuation value of downlink attenuators in the attenuator unit 930 thereof in order to adjust the ratio of a plurality of base station signals of the same frequency band to share a fixed composite output power of the RUs 250, and the COM unit 820 operates in the uplink to apply the same value as applied to the downlink also to uplink attenuators in the attenuator unit 930 thereof.

Figure 10:
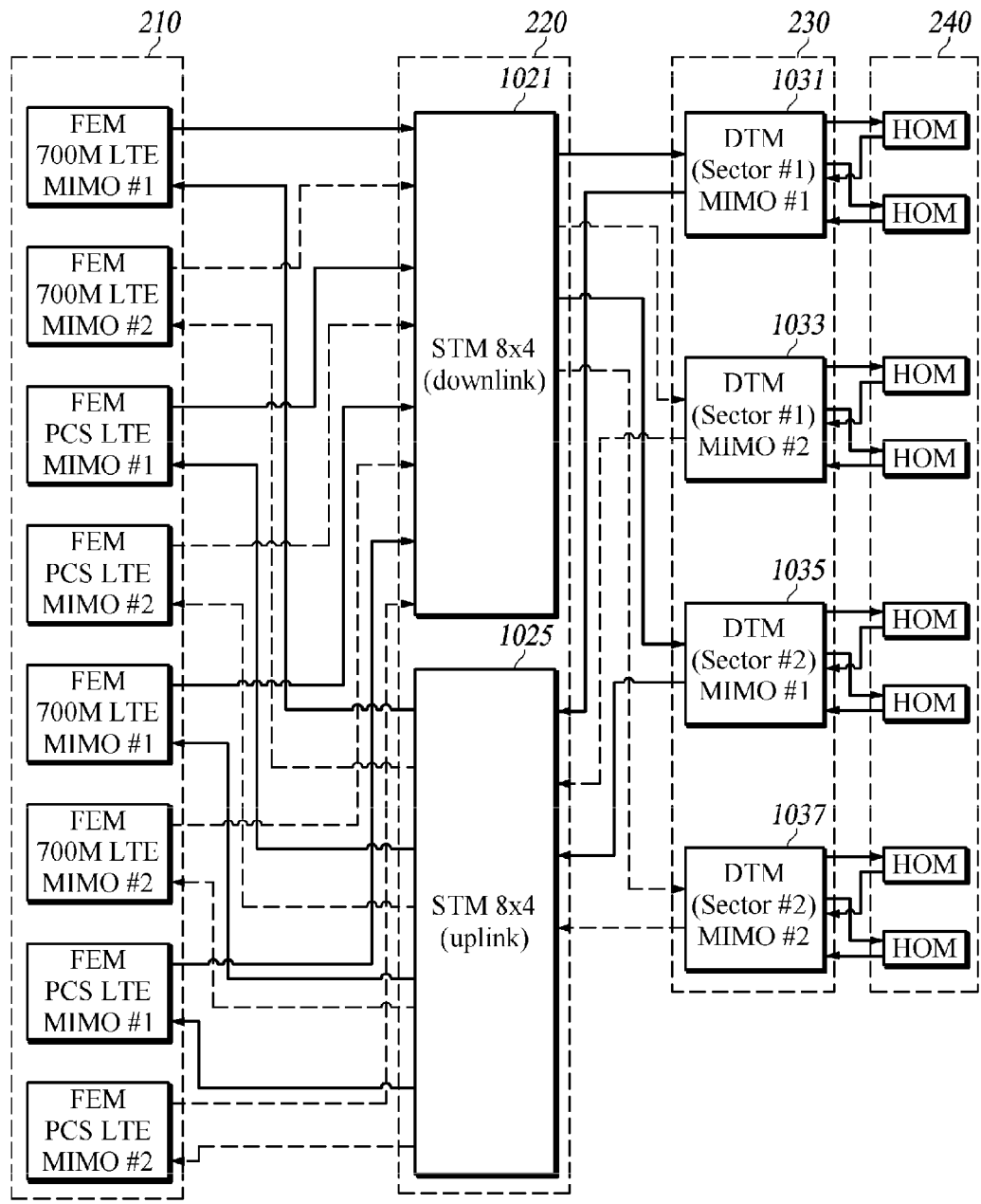
FIG. 10 is a diagram of a configuration of a DAS for supporting an adaptive sectorization in MIMO (Multi-Input Multi-Output) configuration, according to at least one embodiment.

FIG. 10 is a block diagram with a configuration of a DAS for supporting an adaptive sectorization in MIMO (Multi-Input Multi-Output) configuration, according to at least one embodiment. In the example shown in FIG. 10, an adaptive sectorization supports two sectors with 2×2 MIMO configuration for each sector by using each 8×4 STM. Therefore, this embodiment exhibits a configuration that can simultaneously support multiple MIMO-based sectors and multiple SISO-based sectors by using a single 8×4 STM unit In some embodiments, the STM unit 220 provides a separate attenuation in each path for a base station input signal that constitutes a specific sector signal, thus supporting a function of adjusting power ratios of a plurality of base station signals outputted to the RUs 250, in the same frequency band. Further, an ALC (Auto Level Control) function is also supported not to allow the outputs combined for each sector to exceed a predetermined ALC level. Details on this aspect is described with reference to the below examples.

FIGS. 11A and 11B are sectorization tables of a DAS, for the first 8×4 STM unit and the second 8×4 STM unit respectively, according to at least one embodiment. In FIGS. 11A and 11B, a user defines a sectorization table for the first 8×4 STM unit and the second 8×4 STM unit. With multiple input signals being in the same frequency band, the respective input power ratios are assumed to be defined as in the tables of FIGS. 11A and 11B.

In FIGS. 11A and 11B, it is assumed that the total of 16 inputs is received via two 8×4 STM units, and four sectors are supported with a combination of these inputs. A sum of the power ratios in the same frequency band for each sector should be 100%. The power ratio of 100% becomes the maximum output in the corresponding frequency band of the RUs 250 connected to each sector.

FIG. 12 is a table of user-defined power ratios of a DAS, for PCS band of a first sector, according to at least one embodiment. The table shows the power ratios defined by the user for a PCS band of the first sector and attenuation values in the corresponding paths obtained by using user-defined power ratios. It is confirmed that the sum of the power ratios is equal to 100%. The ATT value in the corresponding path that satisfies the power ratio for each input port assigned by the user is calculated by Equation 1.

$$ATT\ value = -10 \times \log 10(P_R) \quad \text{Equation 1}$$

In Equation 1, $P_R$ is the power ratio in the corresponding path.

FIG. 13 is a table of maximum powers of a DAS for each path, provided an RU (Remote Unit) has the maximum output power of 30 dBm, according to at least one embodiment. When the composite output power of the RUs 250 is 30 dBm, the maximum output for each path is the value shown in a table of FIG. 13.

The user generates a sectorization table for a configurable or adaptive sectorization by using a tool provided in the DAS. When the user uses the DAS tool, the sector-specific ATT values for each frequency are automatically calculated.

The STM unit 220 applies the ALC function to the combined output, and in this case, the ALC operation level to be applied is calculated by Equation 2. When the ALC is operated according to a calculation result of Equation 2, the sector-specific power ratio for each frequency can be maintained in the output of the RUs 250.

$$L_{ALC} = P_{MAX} + 10 \times \log 10(P_{RSUM}) \quad \text{Equation 2}$$

In Equation 2, $L_{ALC}$ is sector-specific DL (Downlink) (or UL (Uplink)) ALC level value of each STM, $P_{MAX}$ is the maximum DL output (or UL input) for each frequency band of the STM unit, and $P_{RSUM}$ is the total sum of the sector-specific power ratios of each STM.

When the maximum DL output for each frequency band of the STM unit is −12 dBm, the DL ALC level of the first sector of the first STM is calculated by Equation 3.

$$\begin{aligned} L_{ALC} &= -12dBm + 10 \times \log 10 \\ &\quad (20\% + 30\% + 10\% + 5\% + 5\% + 30\% + 30\% + 40\%) \\ &= -12dBm + 10 \times \log 10(170\%) = -9.7dBm \end{aligned} \quad \text{Equation 3}$$

Embodiments in some aspects of the present disclosure include supporting a programmable configurable sectorization function. This function can optimize the performance of the DAS by rearranging the service coverage and the capacity supported by the DAS according to a change of the traffic.

For example, in a stadium such as a ball park, a massive traffic is generated temporarily around a parking lot and the ball park before and after a game. During the game, the traffic exists in most areas in the ballpark. Further, when there is no game, virtually no traffic exists in the ball park, and even around the ball park with a very small traffic present compared to game days. Various sectorization tables are generated according to various situations as described above and saved as files, and then a desired sectorization table can be loaded and applied as appropriate by using a tool that support a user interface. By programming the sectorization tables to be applied appropriately depending on time and place, a function of automatically applying the sectorization tables depending on changing situations can be provided.

Providing this function can be a solution for optimizing the coverage area and capacity that can be supported by the applied DAS in case of applying a configurable sectorization function to traffic changes that exhibit a relatively regular pattern depending on time and place.

As described above, according to some embodiments of the present disclosure, the DAS that supports a sectorization can support a plurality of sectors as needed in a flexible manner simply by increasing the STMs (Sectorization Modules) regardless of hardware configuration. For non-sectorization applications, the STMs are changed to the COMs (Head-end Combining Modules) that are free of unnecessary circuits, and hence the sectors are supported with a simple structure.

The DAS according to some embodiments of the present disclosure is configured to provide a structure for coupling a desired base station signal to a sector and to also support a MIMO (Multi-Input Multi-Output).

Exemplary embodiments in this disclosure and drawings are intended to illustrate rather than to limit the technical idea of the present disclosure. The exemplary embodiments of the present disclosure have been described for the sake of brevity and clarity. Accordingly, one of ordinary skill would understand the scope of the claimed disclosure is not to be limited by the explicitly described above embodiments but by the claims and equivalents thereof.

What is claimed is:

1. A head-end unit for supporting a variable sectorization in a DAS (Distributed Antenna System), the head-end unit comprising:
a plurality of FEMs (Front-end Modules), each FEM being configured to:
receive a downlink RF signal of a corresponding base station among a plurality of supporting base stations,
filter the downlink RF signal to generate a filtered signal, and
adjust a power level of the filtered signal to generate a level-adjusted signal;
at least one downlink STM (Sectorization Module) being configured to:
split each of the level-adjusted signals into a plurality of splitted signals by the number of supporting sectors,
selectively attenuate at least one of the plurality of splitted signals in order to control a combination of the respective splitted signals associated with the individual level-adjusted signals for each of the supporting sectors, wherein the selectively attenuating includes applying the maximum amount of attenuation to the at least one of the plurality of splitted signals that requires not to be distributed to the supporting sectors, and
combine the selectively attenuated signals to generate a respective downlink sector signal for each of the supporting sectors;
a plurality of DTMs (Distribution Modules), each dedicated to respective supporting sector, being connected to at least one HOM (Head-end Optic Module) and being configured to distribute the downlink sector signal to said at least one HOM; and
a plurality of HOMs, each being optically connected to a remote unit located in the supporting sectors and being configured to transmit the downlink sector signal to the remote unit.

2. The head-end unit according to claim 1, wherein the downlink STM comprises:
a plurality of downlink splitters, each being configured to split the level-adjusted signal into a plurality of splitted signals by the number of the supporting sectors;
a plurality of downlink combiners, each being assigned to a corresponding sector among the supporting sectors and being configured to combine the selectively attenuated signals;
a plurality of downlink RF circuits for connecting each downlink splitter to all the plurality of downlink combiners, wherein each downlink RF circuit comprises a downlink attenuator connected to an output port of the downlink splitter and a first downlink power controller connected to an input port of the downlink combiner;
a plurality of second downlink power controllers, each being connected to an output port of a corresponding downlink combiner among the plurality of downlink combiners; and
a plurality of downlink power detectors, each downlink power detector being configured to detect a power level at an output port of a corresponding downlink combiner among the plurality of downlink combiners.

3. The head-end unit according to claim 2, wherein the downlink STM is configured to adjust an attenuation value of each downlink attenuator in the plurality of downlink RF circuits, to thereby control a combination of the respective splitted signals associated with the individual level-adjusted signals for each of the supporting sectors.

4. The head-end unit according to claim 2, wherein the downlink STM is configured to adjust an attenuation value of each first downlink power controller in the plurality of downlink RF circuits, to thereby control, for each sector, power ratios of a plurality of splitted signals outputted in a same frequency band at the remote unit for each of the supporting sectors.

5. The head-end unit according to claim 2, wherein the downlink STM is configured to control, based on the power levels detected by the plurality of downlink power detectors, the second downlink power controllers in the plurality of downlink RF circuits, to thereby control each of supporting sectors, such that the power levels of the downlink sector signal not to exceed a predetermined maximum power level.

6. The head-end unit according to claim 2, wherein the downlink STM further comprises at least one lookup table defining operation conditions for the downlink attenuators, the first downlink power controllers and the first downlink power controllers in different sectorizations, and the downlink STM is further configured to perform a variable sectorization by using the look-up table.

7. The head-end unit according to claim 6, further comprising a tool capable of supporting a user interface to generate, modify and change the lookup table.

8. The head-end unit according to claim 7, wherein the tool is capable of exporting the lookup table to an external software tool and importing a new lookup table generated by the external software tool.

9. The head-end unit according to claim 6, wherein the DAS is including an external software tool capable of: generating a new lookup table; importing the lookup table from the head-end unit; modifying an imported lookup table; and exporting a modified lookup table or a newly generated lookup table.

10. The head-end unit according to claim 6, wherein the downlink STM is further configured to perform a variable sectorization by using different look-up tables depending on time of day or which day of the week.

11. The head-end unit according to claim 1, wherein in case of increasing the number of required FEMs, the head-end unit is configured to provide variable sectorization by adding the STMs correspondingly without an increase of the numbers of the DTMs and the HOMs.

12. The head-end unit according to claim 1, wherein in case of increasing the number of required sectors, a DAS are configured to provide variable sectorization by adding the STMs correspondingly without an increase of the numbers of the DTMs and the HOMs.

13. The head-end unit according to claim 1, wherein each of the plurality of HOMs is further configured to optically receive a uplink signal from the corresponding remote unit, and
wherein each of the plurality of DTMs is further configured to generate a uplink RF sector signal based on at least one uplink signal transferred by said at least one HOM, and
wherein the head-end unit further comprises at least one uplink STM (Sectorization Module) being configured to:

split each of the uplink RF sector signals into a plurality of splitted signals by the number of supporting base stations;
selectively attenuate at least one of the plurality of splitted signals to control a combination of the respective splitted signals associated with the individual uplink RF sector signals for each of the supporting base stations, wherein the selectively attenuating includes applying the maximum amount of attenuation to the at least one of the plurality of splitted signals that requires not to be distributed to the supporting sectors;
combine the selectively attenuated signals to generate a respective uplink RF signal for each of the supporting base stations; and
transmit the up-link RF signals for each of the supporting base stations to the FEMs.

14. The head-end unit according to claim 13, wherein the uplink STM comprises:
a plurality of uplink power detectors, each being configured to detect power level of the uplink RF sector signal received from a corresponding DTM among the plurality of DTMs;
a plurality of power controllers, each being configured to receive the uplink RF sector signal from one corresponding DTM among the plurality of DTMs and adjust the power level of the uplink RF sector signal;
a plurality of uplink splitters configured to split each of the level-adjusted signals into a plurality of splitted signals by the number of the supporting base stations;
a plurality of uplink combiners, each being configured to generate a uplink RF signal associated with a corresponding base station; and
a plurality of uplink RF circuits for connecting each uplink splitter to all the plurality of uplink combiners, each uplink RF circuit comprising a first uplink attenuator connected to an output port of the first splitter and a second uplink attenuator connected to an input port of the first combiner.

15. The head-end unit according to claim 14, wherein the uplink STM further comprises a plurality of RF switches, each RF switch having: a first input port for receiving the uplink RF sector signal; a second input port connected to a termination resistor; and a output port connected to the power controller, and
wherein when the first input port is not used, the RF switch connects the second input port to the output port.

16. The head-end unit according to claim 14, wherein the uplink STM is configured to adjust an attenuation value of each second uplink attenuator in the plurality of uplink RF circuits, to thereby control, for each base station, a combination of the respective splitted signals associated the individual level-adjusted signals for each of the supporting base stations.

17. The head-end unit according to claim 14, wherein the uplink STM is configured to adjust an attenuation value of each first uplink attenuator in the plurality of uplink RF circuits, to thereby control, for each base station, power ratios of a plurality of splitted signals to be formed the uplink RF signal.

18. The head-end unit according to claim 14, wherein the uplink STM is configured to control, based on the power levels detected by the plurality of uplink power detectors, the uplink power controllers in the plurality of uplink RF circuits, to thereby allow the power level of the individual level-adjusted signal not to exceed a predetermined maximum power level.

19. The head-end unit according to claim 14, wherein the uplink STM further comprises at least one lookup table defining operation conditions for the uplink power controllers, the first uplink attenuators, and the second uplink attenuators in different sectorizations, and the uplink STM is further configured to perform a variable sectorization by using the look-up table.

20. A method of supporting a variable sectorization in a DAS (Distributed Antenna System), the method comprising:
receiving a downlink RF signal of a corresponding base station among a plurality of supporting base stations;
filtering the downlink RF signal to generate a filtered signal;
adjusting a power level of the filtered signal to generate a level-adjusted signal;
splitting each of the level-adjusted signals into a plurality of splitted signals by the number of supporting sectors;
selectively attenuating, for each of the supporting sectors, at least one of the plurality of splitted signals in order to control a combination of the respective splitted signals associated with the individual level-adjusted signals, wherein the selectively attenuating includes applying the maximum amount of attenuation to the at least one of the plurality of splitted signals that requires not to be distributed to the supporting sectors;
combining, for each of the supporting sectors, the selectively attenuated signals to generate a downlink sector signal; and
optically transmitting, for each of the supporting sectors, the downlink sector signal to at least one remote unit located in the respective supporting sector.

21. The method according to claim 20, further comprising:
optically receiving uplink signals from the remote units in the supporting sectors,
generating, for the supporting sectors, uplink RF sector signals based on the received uplink signals;
splitting each of the uplink RF sector signals into a plurality of splitted signals by the number of supporting base stations;
selectively attenuate at least one of the plurality of splitted signals to control a combination of the respective splitted signals associated with the individual uplink RF sector signals for each of the supporting base stations;
combining, for each base station, the selectively attenuated signals to generate respective up-link RF signals for each FEMs; and
transmitting the respective up-link RF signals to said each base station.

22. A method of supporting a variable sectorization in a DAS (Distributed Antenna System), the method comprising:
receiving a downlink RF signal of a corresponding base station among a plurality of supporting base stations;
filtering the downlink RF signal to generate a filtered signal;
adjusting a power level of the filtered signal to generate a level-adjusted signal;
presenting a plurality of downlink splitters to split each of level-adjusted signals into a plurality of splitted signals by the number of the supporting sectors;
presenting a plurality of downlink combiners to generate a plurality of downlink sector signals for the supporting sectors;
presenting a plurality of RF circuit to connect each of the plurality of downlink splitters to all the plurality of downlink combiners, each downlink RF circuit comprising a downlink attenuator connected to an output port of the downlink splitter and a downlink power controller connected to an input port of the downlink combiner;

selectively attenuating, by the downlink attenuators, at least one of the plurality of splitted signals for each of the supporting sectors, wherein the selectively attenuating includes applying the maximum amount of attenuation to the at least one of the plurality of splitted signals that requires not to be distributed to the supporting sectors; and optically transmitting, for each of the supporting sectors, the downlink sector signal to at least one remote unit located in the respective supporting sector.

\* \* \* \* \*